United States Patent [19]
Hesterman

[11] 3,965,411
[45] June 22, 1976

[54] GRADIENT WOUND TRIM COIL FOR TRIMMING A PRIMARY PICKUP COIL

[75] Inventor: Victor W. Hesterman, Palo Alto, Calif.

[73] Assignee: Develco, Inc., Mountain View, Calif.

[22] Filed: Jan. 21, 1974

[21] Appl. No.: 434,857

[52] U.S. Cl. ............................ 323/44 F; 324/43 G
[51] Int. Cl.² ........................................ G01R 33/02
[58] Field of Search ..................... 307/306; 310/15; 317/123, 262 R; 323/44 F; 324/43 R, 43 G; 336/226, DIG. 1

[56] References Cited
UNITED STATES PATENTS
3,582,779  6/1971  Bloom ........................... 317/123 X Primary Examiner—A. D. Pellinen
Attorney, Agent, or Firm—Lowhurst & Aine

[57] ABSTRACT

One or more primary superconductive magnetic field pickup coils are trimmed by means of one or more auxiliary super-conductive trim coils coupled to a magnetic flux sensor for sensing the magnetic flux coupled to the sensor by said primary and auxiliary coil circuits. The trim coils preferably each have their respective magnetic axes oriented orthogonally to each other for independent adjustment. The trim coils are wound in the gradient configuration and an adjustable superconductive magnetic shield is provided surrounding each of the respective trim coils for varying the coupling between the respective trim coil and the magnetic field by varying the position of the magnetic shield relative to a null or symmetric position relative to the trim coil. In a preferred embodiment, there are three mutually orthogonal trim coils.

7 Claims, 6 Drawing Figures

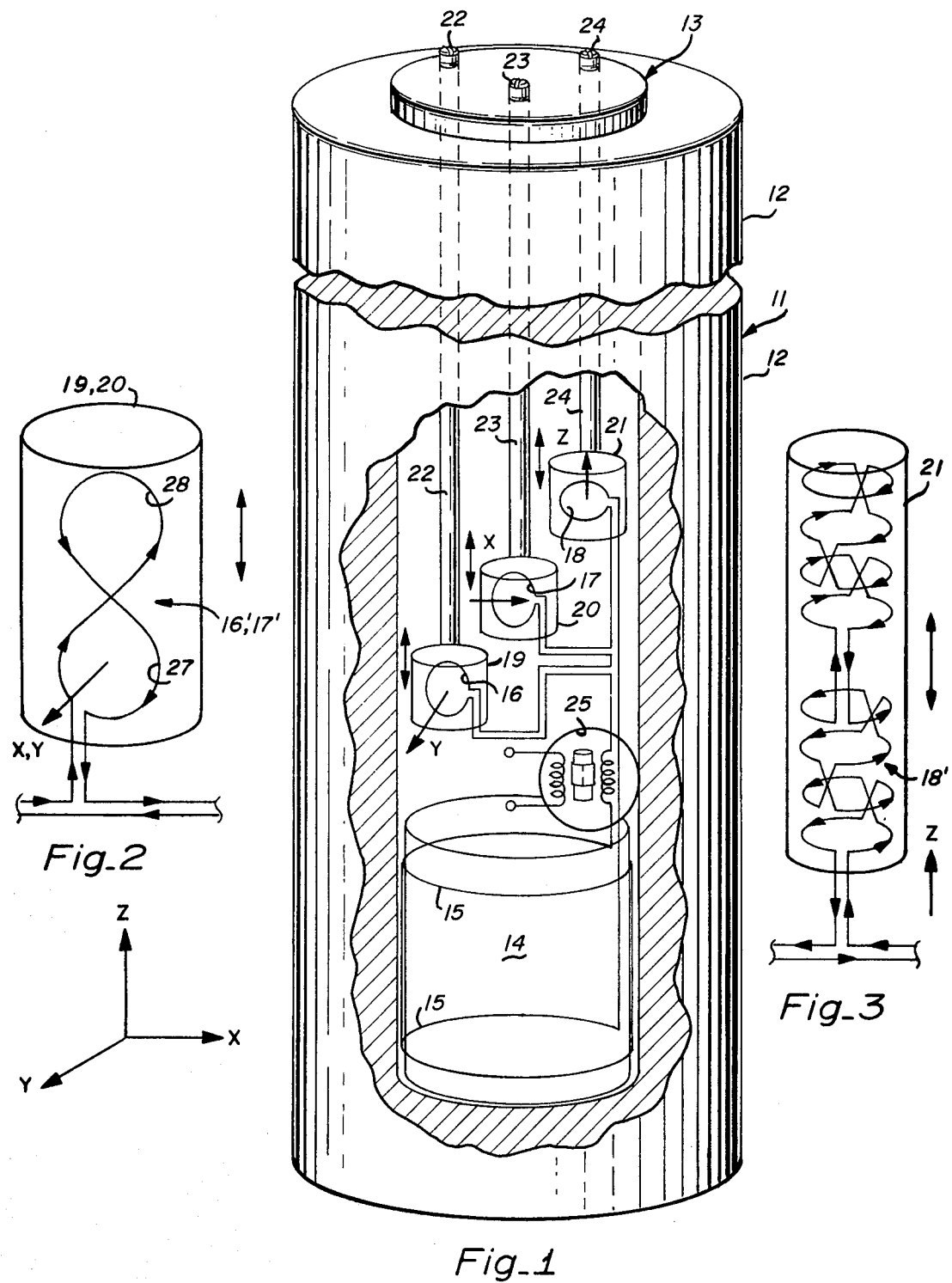

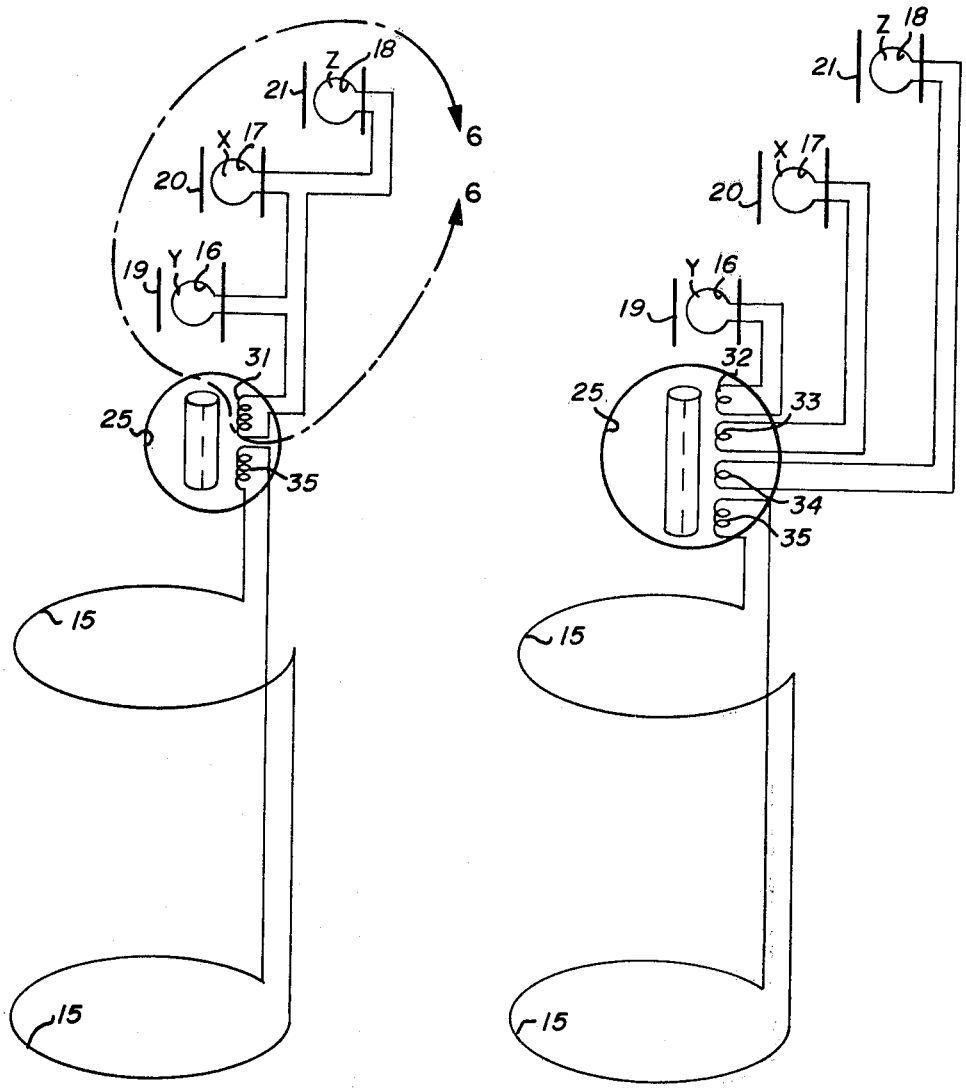
Fig_4    Fig_5
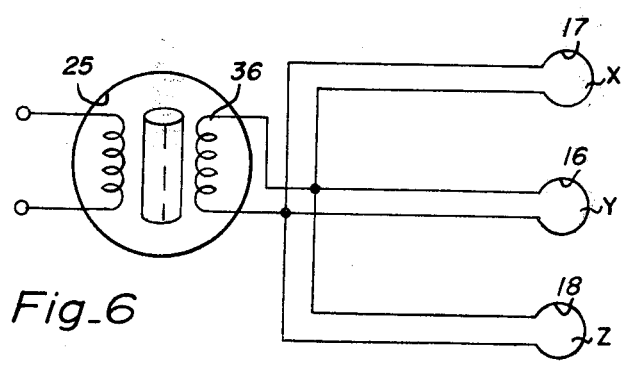
Fig_6

GRADIENT WOUND TRIM COIL FOR TRIMMING A PRIMARY PICKUP COIL

GOVERNMENT CONTRACT

The invention herein described was made in the course of or under a contract or subcontract thereunder, (or grant) with the Department of the Navy.

RELATED CASES

The use of an auxiliary trim coil coupled to the primary pickup coil and including a movable superconductive magnetic shield for varying the trim of the system is disclosed and claimed in copending U.S. patent application Ser. No. 435,112 filed Jan. 21, 1974 and assigned to the same assignee as the present invention.

BACKGROUND OF THE INVENTION

The invention relates in general to superconductive magnetic gradiometer or magnetometer pickup circuits wherein variably shielded superconductive trim coils are coupled to a sensor for combining in the sensor the flux coupled to the sensor by the primary magnetic pickup coil and the flux coupled to the sensor by the trim pickup coils for trimming the gradiometer or magnetometer.

DESCRIPTION OF THE PRIOR ART

Heretofore, a superconductive gradient pickup coil system has been trimmed or balanced (compensated) for axial and transverse misalignments of the primary pickup coils by means of a plurality of trim coil portions manually pulled out of the primary superconductive gradiometer pickup coil circuit by the operator. The trim coils had their magnetic axes oriented relative to the primary pickup coils by manually twisting the plane of the respective trim (balance) coil relative to the plane of the pickup coils. The adjustment of the trim coils was obtained by manually increasing or decreasing the enclosed area of the respective trim coil and by manually changing its orientation in the magnetic field.

In an alternative prior art gradiometer trim or balance system, the primary magnetic gradiometer pickup coils were trimmed by means of superconductive vanes disposed in the vicinity of the pickup coils and moved such as to shift the degree of magnetic coupling of one of the primary pickup coils relative to the other. In this latter embodiment, transverse trim was obtained by means of vanes disposed about the periphery of the pickup coils, whereas axial trim was obtained by shifting the axial position of a superconductive obstacle disposed intermediate and on the axis of two primary gradiometer pickup coils.

A gradiometer trim system employing superconductive vanes and obstacles for achieving transverse and axial trim is described in a National Bureau of Standards report titled, "Ultrasensitive Superconducting Magnetic Gradiometer, N.B.S. Project No. 2750482, N.B.S. Report No. 10,736 of Mar. 31, 1972" carried out at the U.S. Department of Commerce National Bureau of Standards under the sponsorship of the Department of the Navy under Contract NAonr-13-71.

The problem with the first method of trimming a gradiometer primary pickup coil which employed small pulled-out loop portions of the primary windings was that this system did not include means for changing the trim of the gradiometer while the coils were superconductive. More particularly, trim was achieved by a series of cut and try experiments wherein a first manual adjustment of the trim coils was obtained at room temperature, the system was then immersed in liquid helium and rendered superconductive. The balance was noted, the system was then removed from the helium, another manual adjustment made, and then returned to the helium. Thus, adjustments were made only by repeated cycling of the gradiometer sytem between a superconductive and normal state. This turned out to be an extremely tedious, time-consuming, and a relatively inaccurate method for obtaining trim of the gradiometer pickup coils.

In the second prior art method of trimming the gradiometer which employed the movable vanes and obstacles, the adjustment turned out to be highly non-linear, that is, in certain positions of the vanes, a relatively large movement produced a relatively small change in the degree of trim between the pickup coils, whereas in another position a very small movement of the vanes produced a relatively large change in the trim of the primary gradiometer pickup coils. In addition, there was an objectionable amount of mutual interaction between the various adjustments of the vanes.

SUMMARY OF THE PRESENT INVENTION

The principal object of the present invention is provision of an improved method and apparatus for trimming superconductive primary magnetic pickup coil circuits.

In one feature of the present invention, a superconductive trim coil of a gradient wound configuration is employed with a movable superconductive member for producing a gradient in the magnetic flux coupled into the trim coil for varying the magnitude and sense of trim flux coupled into the magnetic flux sensor which senses flux picked up by the primary superconductive pick-up coil circuit for trimming the primary pickup coil circuit.

In another feature of the present invention, there are at least two and preferably three mutually orthogonal trim coils of the gradient wound configuration, whereby independent control over separate trim adjustments of the primary pickup circuit is obtained.

In another feature of the present invention, a superconductive shield which surrounds the trim coil is translated axially along the shield for varying the degree of coupling between the magnetic field and the respective trim coil.

Other features and advantages of the present invention will become apparent upon a perusal of the following specification taken in connection with the accompanying drawings wherein:

BRIEF DESCRIPTION OF THE DRAWINGS

FIG. 1 is a schematic perspective elevational view, partly in section, depicting a superconductive gradiometer employing balance coils of the present invention, FIG. 2 is an enlarged perspective view of an alternative transverse balance coil, FIG. 3 is an enlarged perspective view of an alternative axial balance coil, FIG. 4 is a simplified view of a primary pickup and trim coil porton of a superconductive system similar to that of FIG. 1 showing an alternative embodiment of the present invention, FIG. 5 is a view similar to that of FIG. 4 depicting an alternative embodiment of the present invention, and FIG. 6 is a view of an alternative embodiment of a portion of the circuit of FIG. 4 delineated by line 6—6.

DESCRIPTION OF THE PREFERRED EMBODIMENTS

Referring now to FIG. 1, there is shown a superconductive magnetic sensing device 11 to incorporate features of the present invention. The superconductive sensing device 11 includes a conventional non-magnetic liquid helium dewer flask having an axially insertable generally cylindrical insert 13. The insert 13 is for immersing the superconductive magnetic sensing circuits in the liquid helium reservoir of the dewer flask 12 for cooling and maintaining the temperature of the superconductive circuits at or very near liquid helium temperature.

The insert 13 includes a cylindrical coil form 14, as of quartz or fiberglass, onto which is wound a primary magnetic pickup coil circuit 15. In the case of a magnetometer, the primary pickup coil circuit would include only one pickup coil. However, in the case of a gradiometer two or more spaced apart primary pickup coils are employed in the primary pickup coil circuit 15, as shown in FIG. 1. In the case of the gradiometer, as shown in FIG. 1, the pair of primary magnetic field pickup coils 15 are wound in magnetic field bucking relation such that a series current flowing through the coils produces a magnetic field gradient at the center of the coils of the type to be detected. In the example as shown in FIG. 1, the pair of coils 15 are wound on the cylindrical coil form 14 such that their magnetic axes are coaxial with the Z-axis. The coils are wound such that the plane of each coil lies in one of a pair of axially spaced XY planes. In addition, the coils are preferably wound to have equal turns and equal enclosed area, i.e. equal area to within reasonable mechanical tolerances such as one part in a thousand.

A plurality of auxiliary superconductive trim coils 16–18 are electrically connected in series with the primary coils 15. The trim coils 16–18 are preferably wound with their magnetic axes disposed in mutually orthogonal relations, i.e., in alignment with the Y, X, and Z axes, respectively. The enclosed area of each of the trim coils 16–18 is made to be small compared to the enclosed area of each of the primary coils 15. In a typical example, each of the auxiliary trim coils 16–18 encloses only 1/300th of the enclosed area of each of the primary coils 15. The product of enclosed area times the number of turns for the respective trim coil is on the order of preferably A times the same product for each of the primary coils 15, where A is the accuracy of the physical and electrical alignment of the primary coils to be corrected, i.e. A one part in a thousand.

Superconductive cylindrical magnetic shields or loops 19–21, as of lead, are disposed surrounding each of the auxiliary trim coils 16–18, respectively. Suitable mechanical actuating mechanisms 22, 23, and 24, such as axially captured worm rods, extend axially of the insert 13 and each is mechanically coupled to each of the respective shields 19–21 in a conventional manner, as by rotationally captured nuts traveling on the worm rods with the nuts coupled to the shields, for effecting axial translation of each of the shields 19–21 for varying the coupling between the respective trim coils 16–18 and the magnetic field in which they are immersed.

In the arrangement of FIG. 1, the trim coils 16–18 are arranged for coupling certain components of trim magnetic flux into the circuit of the primary pickup coils 15. Each component of trim magnetic flux is adjustable by positioning a corresponding one of the respective shields 19–21 between a completely shielding and a completely unshielding position. For the sake of explanation, it will be assumed that each of the trim coils 16–18 couples a positive trim magnetic flux into the primary pickup coil circuit 15. This positive trim flux is variable by positioning the shields. However, there is no way that such positioning of the shields can couple a trim magnetic flux of negative sign into the primary pickup coil circuit 15. However, the primary coil circuit 15 can be initially wound such that there is a net negative balance to the flux coupled into the primary circuit 15 such that the positive trim flux coupled into the circuit 15 by the positive trim coils 16–18 is such as to correct both the initial axial and transverse unbalance of the primary pickup coil circuit 15 of the magnetic sensing device.

As an alternative to winding the coils 15 to produce a predetermined sign of the unbalance to be corrected by the auxiliary trim coils, the sense of trim flux coupled into the primary circuit 15 by the respective trim coils 16–18 can be reversed from positive to negative by reversing the electrical connection of the respective coils 16–18 relative to the leads connected to the primary pickup coils 15. The proper sense of the windings for each of the trim coils 16–18 can be determined empirically and if the trim flux coupled into the primary circuit 15 is of the wrong sense, the connection of that particular trim coil can be reversed.

A magnetic flux sensor 25, such as a weak-link Josephson effect sensor, is electromagnetically coupled to the combined magnetic flux coupled into the primary pickup coil circuit 15 and into the auxiliary trim coil circuits for deriving an output proportional to the total flux coupled into the trimmed primary pickup coil circuit 15. Alternative magnetic flux sensors 25 include non-superconductive magnetic flux sensors. Suitable weak-link Josephson effect sensors 25 include a superconducting point contact, a Dayem bridge, and Notary's bridge.

As an alternative to reversing the connection of the individual trim coils 16–18 to achieve the proper sense of the coupled trim flux, gradient-type coil circuits 16', 17', and 18' are employed. More particularly, referring now to FIG. 2, there is shown a suitable X and/or Y trim coil circuit 16' and 17', of the present invention, wherein the superconductive trim coil circuit 16' and 17' includes first and second loop portions 27 and 28 of substantially equal area wound in the opposite (gradient) sense in the overall shape of a figure "8" such that, if the coil 16' and 17' is immersed in a uniform magnetic field, no net flux will be picked up by the superconductive trim coil circuit. The magnetic shield 19 or 20 is movable along the axis of the FIG. 8-shaped trim coil 16' or 17' to cause an imbalance in the magnetic flux permeating the respective loops 27 and 28 to cause a trim flux to be picked up by the coil circuit 16' or 17' of either positive or negative sense depending on whether the shield 19 or 20 provides more shielding for the upper or lower loop portion 28 or 27, respectively. When the shield 19 or 20 is axially symmetric relative to the FIG. "8" trim pickup coil, zero trim flux will be coupled into the circuit of the primary pickup coil or coils 15.

Referring now to FIG. 3, there is shown the gradient-type wound trim coil 18' alternative to the Z-axis trim coil 18 of FIG. 1. More particularly, the gradient-wound trim coil 18', for providing axial trim fo the magnetic field pickup coil circuit 15, comprises a pair of bucking-series connected coils 18' coaxially aligned with the Z-axis. The magnetic shield 21 is axially aligned with the Z-axis. The magnetic shield 21 is axially movable relative to the coils 18' for varying the coupling of magnetic flux between the respective halves of the bucking connected coil pair 18' and the magnetic field in which the coils are immersed. When the shield 21 is symmetrically disposed relative to the two halves of the winding 18', zero magnetic trim flux will be picked up and coupled into circuit with the primary pickup coils 15. However, as the shield 21 is moved off-center of the auxiliary trim coil pair 18' the magnetic flux picked up is increased in one-half of the winding relative to the other half to produce either a positive or negative net magnetic trim flux coupling into the circuit of the primary magnetic pickup windings 15.

Referring now to FIG. 4, there is shown an alternative trimmed gradient coil circuit of the present invention. More particularly, the primary gradient pickup coil circuit 15 is substantially the same as previously described with regard to FIG. 1. However, the X, Y, and Z axes trim coils 16, 17, and 18 are connected in series in a superconductive trim circuit electrically independent of the primary gradiometer pickup coil circuit 15. In other words, the primary pickup circuit 15, including its primary winding 35 for coupling magnetic flux picked up by the gradiometer pickup circuit 15 into the sensor 25, is electrically separate from a primary winding 31, employed in series with the superconductive trim coil circuit 16, 17, and 18, for coupling trim magnetic flux into the sensor 25. The advantage to the circuit of FIG. 4 is that the trim coil circuit does not have to interrupt the primary gradient pickup circuit 15. This allows substitution of different types of primary pickup coil circuits 15 while allowing use of one trim coil circuit. In addition, the modular construction, which employs a trim coil circuit separate from the primary pickup coil circuit, is less expensive to manufacture, as a malfunction in one or the other of the two circuits does not require that both circuits be replaced.

Referring now to FIG. 5, there is shown a trimmed primary magnetic pickup circuit 15 similar to that of FIG. 4 but modified to incorporate individual superconductive trim coil circuits 16–18. More particularly, the circuit of FIG. 5 is similar to that of FIG. 4 in that magnetic flux picked up by the individual trim coil circuits 16, 17, and 18 is coupled to and added in the magnetic flux sensor 25 to the magnetic flux picked up by the primary pickup coil circuit 15 and coupled to the sensor 25. However, in the circuit of FIG. 5 each of the respective trim coil circuits 16–18 is electrically independent of the other and each has its respective primary winding in the sensor 25, namely windings 32, 33, and 34 respectively. In this manner magnetic flux coupled to the sensor 25 by each of the individual trim coil circuits 16, 17, and 18 is added to the flux of the primary pickup circuit 15 as coupled to the sensor 25. An advantage of the circuit of FIG. 5 is that a malfunction in any one of the superconductive circuits 15–18 is independent of the others such that the entire system, in the case of malfunction of one pickup coil, is not rendered inoperative. The malfunction can be repaired by merely repairing one of the circuits as contrasted with having to repair or replace all of the trim and/or primary pickup circuits. As an alternative to the primary sensor windings 32, 33, and 34 being coupled directly into the sensor 25, such windings may be magnetically coupled into the superconductive circuit of the primary pickup circuit 15 such that the flux of the trim coils, instead of being added directly in the sensor 25 is added indirectly in the sensor 25 through the primary pickup circuit 15 and its inductive winding 35.

Referring now to FIG. 6, there is shown an alternative embodiment of the input circuit to the sensor 25. More particularly, in the circuit of FIG. 6, the individual trim coil circuits 16, 17, and 18 are connected in parallel with a single input primary winding 36 of the sensor 25. As mentioned above, magnetic flux coupled to the sensor by the individual trim coils 16, 17, and 18 is added into the sensor 25 via the input winding 36. However, it is not necessary that the trim flux be added directly into the input of the sensor 25 but may be coupled into the primary pickup circuit 15 inductively coupling winding 36 to one of the coils of the primary pickup circuit 15 or by substituting input circuit 36 for input winding 35 of the primary pickup circuit 15. In the latter embodiment, the trimmed primary pickup circuit 15 would be similar to that of FIG. 1 representing a parallel circuit connection as contrasted with the series circuit embodiment of FIG. 1.

An advantage of the auxiliary magnetic trim coil circuits is that trimming adjustments of all three components of the transverse and axial magnetic field may be made without having to repetitively cycle the primary superconductive pickup coil circuit between the superconductive and normal states. In addition, the adjustments of the auxiliary trim coils are mutually orthogonal, whereby the settings can be independently optimized without having to readjust the trimming coil circuits for previous adjustments of one or more of the other trim coil circuit adjustments. In addition, the trimming coil circuit adjustments are relatively linear, when contrasted with the adjustments of the prior art superconductive vanes and obstacles. A further advantage to the use of the gradient wound trim coil of the present invention is that the balance current may be adjusted either positively or negatively relative to a known value, whereby completely arbitrary geometrical and electrical unbalance of the primary sensor coil or coils may be corrected.

What is claimed is:
1. In a superconductive magnetic sensor:
superconductive primary pickup coil circuit means for sensing a component of magnetic field or gradient of a magnetic field in which said primary pickup coil circuit means is disposed by picking up a magnetic flux proportional to the sensed magnetic field or magnetic field gradient component;
an auxiliary superconductive trim coil circuit means wound in a magnetic gradient pickup configuration disposed in said magnetic field common to said primary pickup coil circuit means for picking up a trim magnetic flux proportional to a gradient of the magnetic field in which said trim coil circuit means is immersed;
sensor means electromagnetically coupled to said primary pickup coil means and to said trim coil means for combining magnetic flux picked up by both said primary pickup coil circuit means and said trim coil circuit means to derive an output proportional to the combined magnetic flux picked up by said primary pickup coil circuit means and by said trim coil circuit means; and means for producing a variable localized gradient in the common magnetic field in which said trim coil means is immersed while said auxiliary and primary coil circuit means are superconducting to effect a variable change in the trim magnetic flux coupled into said sensor means.

2. The apparatus of claim 1 wherein said means for producing said variable localized gradient in the common magnetic field includes, magnetic shield means disposed for shielding at least a portion of said trim coil means from at least a portion of the magnetic field in which it is disposed, and means for moving said shield means for producing a variable gradient in the magnetic field coupled into said gradient wound trim coil means and for varying the coupling of said trim coil means to the magnetic field.

3. The apparatus of claim 2 wherein said trim coil means includes first and second trim coil means, each of said trim coil means being oriented relative to each other such that the magnetic axis of one of said trim coil means is mutually orthogonal to the magnetic axis of the other of said trim coil means.

4. The apparatus of claim 3 wherein said trim coil means includes a third superconductive trim coil means, each of said first, second, and third trim coil means being oriented relative to each other such that the magnetic axis of each one of said trim coil means is generally mutually orthogonal to the magnetic axes of the other ones of said trim coil means.

5. The apparatus of claim 2 wherein said shield means includes a loop of superconductive material disposed surrounding said trim coils means, said shield loop being movable axially of said loop and relative to said trim coil means for varying the coupling of said trim coil means to the magnetic field.

6. The apparatus of claim 5 wherein said trim coil means includes first and second loop portions having parallel magnetic axes, said loop portions being spaced apart in the direction of axial movement of said superconductive shield means.

7. The apparatus of claim 6 wherein said magnetic axes of said loop portions are coaxial with each other and with direction of movement of said superconductive shield means.

* * * * *